United States Patent
Ando et al.

(10) Patent No.: US 8,203,468 B2
(45) Date of Patent: Jun. 19, 2012

(54) ELECTRIC CAPACITANCE-TYPE TOUCH SWITCH

(75) Inventors: Yasuyuki Ando, Aichi-ken (JP); Yoshio Kamon, Aichi-ken (JP); Hitoshi Shimada, Aichi-ken (JP)

(73) Assignee: Kojima Press Industry Co., Ltd., Aichi-ken (JP)

( * ) Notice: Subject to any disclaimer, the term of this patent is extended or adjusted under 35 U.S.C. 154(b) by 1187 days.

(21) Appl. No.: 11/788,632

(22) Filed: Apr. 20, 2007

(65) Prior Publication Data

US 2008/0055118 A1   Mar. 6, 2008

(30) Foreign Application Priority Data

Aug. 29, 2006 (JP) .................................. 2006-232207

(51) Int. Cl.
*H03M 11/00* (2006.01)
(52) U.S. Cl. ........................ 341/33; 200/600; 345/170
(58) Field of Classification Search .................. 200/600; 341/33; 345/170
See application file for complete search history.

(56) References Cited

U.S. PATENT DOCUMENTS

| | | | |
|---|---|---|---|
| 4,413,252 A * | 11/1983 | Tyler et al. ...................... | 341/33 |
| 5,239,152 A | 8/1993 | Caldwell et al. | |
| 5,801,340 A * | 9/1998 | Peter ............................. | 178/20.04 |
| 5,867,111 A * | 2/1999 | Caldwell et al. ................. | 341/33 |
| 5,880,718 A * | 3/1999 | Frindle et al. .................. | 345/174 |
| 6,351,072 B1 | 2/2002 | Mutoh et al. | |
| 6,774,505 B1 | 8/2004 | Wnuk | |
| 7,091,886 B2 * | 8/2006 | DePue et al. .................... | 341/33 |
| 7,315,005 B2 * | 1/2008 | Cenedese ....................... | 200/310 |
| 2003/0006701 A1 | 1/2003 | Hanahara et al. | |
| 2005/0083282 A1 * | 4/2005 | Honbo ........................... | 345/87 |
| 2005/0219853 A1 | 10/2005 | Iwai | |
| 2006/0033508 A1 | 2/2006 | Lee | |
| 2006/0054482 A1 | 3/2006 | Radu | |
| 2006/0077187 A1 * | 4/2006 | Shigetaka et al. ............. | 345/173 |
| 2006/0131159 A1 | 6/2006 | Kaps et al. | |
| 2006/0245200 A1 | 11/2006 | Kuwana et al. | |

(Continued)

FOREIGN PATENT DOCUMENTS

CA   2295900   7/2000

(Continued)

OTHER PUBLICATIONS

English translation of Japanese Office Action dated Jul. 29, 2008.

(Continued)

*Primary Examiner* — Albert Wong
(74) *Attorney, Agent, or Firm* — Ganz Law, P.C.

(57) ABSTRACT

An electric capacitance-type touch switch, capable of reducing malfunction in switching operations and improving the degree of freedom in the visual design of switch, includes a detection circuit that can detect an electric capacitance change occurring when a human body approaches or contacts to an electrode. A sputter layer (i.e., a metallic thin film formed by sputtering) is provided on a surface of an upper lens (i.e., insulating base resin layer). The sputter layer can provide a beautiful metallic glossy appearance similar to a mirror surface. The sputter layer can be used as a panel surface providing a glossy appearance with iridescent or dichromatic effects obtainable from the hue of the base resin layer transmitted via the metallic layer. Furthermore, the sputter layer can be used as an electric capacitance detection electrode.

10 Claims, 4 Drawing Sheets

U.S. PATENT DOCUMENTS

| | | |
|---|---|---|
| 2006/0250142 A1 | 11/2006 | Abe |
| 2007/0211483 A1 | 9/2007 | Ando et al. |
| 2010/0110712 A1 | 5/2010 | Ando et al. |

FOREIGN PATENT DOCUMENTS

| | | |
|---|---|---|
| EP | 1257768 | 11/2002 |
| GB | 2345746 A | 7/2000 |
| JP | 59-173943 | 11/1984 |
| JP | 61243401 | 10/1986 |
| JP | 63-98238 | 6/1988 |
| JP | 01-258325 | 10/1989 |
| JP | HEI 5-90754 | 12/1993 |
| JP | 6162888 | 6/1994 |
| JP | 3021894 | 12/1995 |
| JP | 9048279 | 2/1997 |
| JP | 09-288944 | 4/1997 |
| JP | 11136116 | 5/1999 |
| JP | 2000182784 | 6/2000 |
| JP | 2000-207929 | 7/2000 |
| JP | 2001014951 | 1/2001 |
| JP | 2002-316579 | 10/2002 |
| JP | 2003-523891 T | 8/2003 |
| JP | 2004103285 | 4/2004 |
| JP | 2005-029164 | 2/2005 |
| JP | 2005050635 | 2/2005 |
| JP | 2005228563 | 8/2005 |
| JP | 2005-231518 | 9/2005 |
| JP | 2005-324607 | 11/2005 |
| JP | 2006-182284 | 7/2006 |
| JP | 2006-196395 | 7/2006 |
| JP | 2006306305 | 11/2006 |
| JP | 2007055551 | 3/2007 |
| JP | 2007-134293 | 5/2007 |
| JP | 2007-230450 | 9/2007 |
| JP | 2008087566 | 4/2008 |
| WO | WO0163172 A1 | 8/2001 |
| WO | 2004/059343 | 7/2004 |

OTHER PUBLICATIONS

Office Action dated Feb. 3, 2009, for Japanese Application No. 2006-329094 including English translation, 4 pgs. (The office action cites JP2006-196395A and JP6-162888A, which are already of record in this case).

Office Action dated Aug. 19, 2008 for related Japanese patent application No. 2006-056837 including English Translation; 4 pages.

Office Action dated Sep. 16, 2008 for related Japanese patent application No. 2006-232207 including English Translation; 4 pages.

Third Party Information Disclosure Statement filed Nov. 12, 2007 in Japanese Patent Office fo corresponding Japanese Application No. 2006-56837, English cover sheet included, 6 pages.

Office Action dated Nov. 11, 2008 for related Japanese patent application No. JP2006329094 including English Translation; 6 pages.

Office Action dated Oct. 20, 2009 for corresponding Japanese patent application No. JP2006232207 including English Translation; 4 pages.

Office Action dated Jun. 10, 2011 for U.S. Appl. No. 11/839,489 (10 pages total).

* cited by examiner

ELECTRIC CAPACITANCE-TYPE TOUCH SWITCH

PRIORITY INFORMATION

This application claims priority to Japanese Patent Application No. 2006-232207, filed on Aug. 29, 2006, which is incorporated herein by reference in its entirety.

BACKGROUND OF THE INVENTION

1. Field of the Invention

The present invention relates to a touch switch including an electric capacitance detection circuit capable of detecting an electric capacitance change caused when a human body approaches or contacts a conductive layer.

2. Description of the Related Art

A conventional touch switch can detect an electric capacitance change caused in the vicinity of a panel surface when a finger comes near to or contacts the panel surface.

FIG. 1 illustrates a conventional touch switch 100 including an insulating base resin layer 10, a metallic layer 12 formed on a reverse surface of the insulating base resin layer 10, and an electric capacitance detection circuit 14 electrically connected to the metallic layer 12 (refer to Japanese Patent Application Laid-open Publication No. 2005-228563 or Japanese Patent Application Laid-open Publication No. Hei 11-136116). FIG. 2 illustrates a conventional touch switch 200 including a metallic layer 16 and an electric capacitance detection circuit 18 electrically connected to the metallic layer 16 (refer to Japanese Patent Application Laid-open Publication No. 2004-103285).

According to the touch switch 100 shown in FIG. 1, when a person places their finger near or on the base resin layer 10, an electric capacitance change occurs between the finger and the metallic layer 12 formed on the reverse surface of the base resin layer 10. The electric capacitance detection circuit 14 connected to the metallic layer 12 can detect the electric capacitance change.

According to the touch switch 200 shown in FIG. 2, when a user's finger directly contacts the metallic layer 16, an electric capacitance change occurs and the electric capacitance detection circuit 18 connected to the metallic layer 16 can detect the electric capacitance change.

In other words, the touch switch 100 shown in FIG. 1 indirectly detects an electric capacitance change via the base resin layer 10. When the distance between a finger and the metallic layer 12 is large, the change in the electric capacitance that must be detected by the touch switch 100 is small.

The change in the electric capacitance when a finger contacts the base resin layer 10 is also small when the base resin layer 10 is relatively thick, i.e., when the distance between a finger and the metallic layer 12 is large. When the electric capacitance change is small, it is difficult to determine whether a user's finger has approached or contacted the base resin layer 10. In other words, the switch sensitivity deteriorates.

Furthermore, the electric capacitance detectable by the electric capacitance detection circuit 14 varies depending on environmental conditions, such as presence of other metallic substances, temperature, humidity, and environment surrounding the switch. Therefore, the electric capacitance is dependent on environmental factors and cannot be used to accurately detect the approach or contact of a user's finger.

Meanwhile, when it is possible to accurately detect a finger approaching irrespective of the magnitude of electric capacitance change, it may be desirable to employ a special control circuit and control software, as shown in Japanese Patent Application Laid-open Publication No. Hei 11-136116. However, a touch switch incorporating such a specialized control circuit and software is structurally complicated and more expensive.

On the other hand, according to the touch switch 200 shown in FIG. 2, the metallic layer 16 is exposed on the switch surface and a user's finger can directly contact the metallic layer 16. Compared to the touch switch 100 shown in FIG. 1, the touch switch 200 can produce a sufficiently large electric capacitance change. However, the touch switch 200 is disadvantageous in that the visual design of switch is restricted by the requirement that the metallic layer 16 be directly exposed on the surface of the switch.

SUMMARY OF THE INVENTION

The present invention advantageously provides a touch switch capable of reducing malfunction in switching operations and also capable of improving the degree of freedom with respect to the visual design of switch.

The present invention provides a touch switch including an insulating base resin layer; a conductive layer provided on a surface of the base resin layer; and an electric capacitance detection circuit electrically connected to the conductive layer to detect an electric capacitance change caused when a human body approaches or contacts the conductive layer, wherein the conductive layer is a layer formed by sputtering, vaporization, plating, or metallic painting.

According to the present invention, a user can touch a conductive layer (i.e., a switch portion) formed on a base resin layer. The present invention can realize a touch switch capable of obtaining a large electric capacitance change (i.e., detection object) without deteriorating the visual design of touch switch. Furthermore, the present invention can reduce the malfunction in switching operations.

Moreover, according to the present invention, a panel surface on the base resin layer is formed by sputtering, vaporization, plating, or metallic painting. Therefore, the present invention can realize a panel surface having the hue of metallic gloss or the hue of base resin layer and, accordingly, can improve the degree of freedom in the visual design of touch switch.

BRIEF DESCRIPTION OF THE DRAWINGS

The accompanying drawings, which are incorporated in and constitute a part of the specification, illustrate a preferred embodiment of the invention and, together with the description, serve to explain the principles of the invention, in which.

DESCRIPTION OF PREFERRED EMBODIMENT

Figure 1:
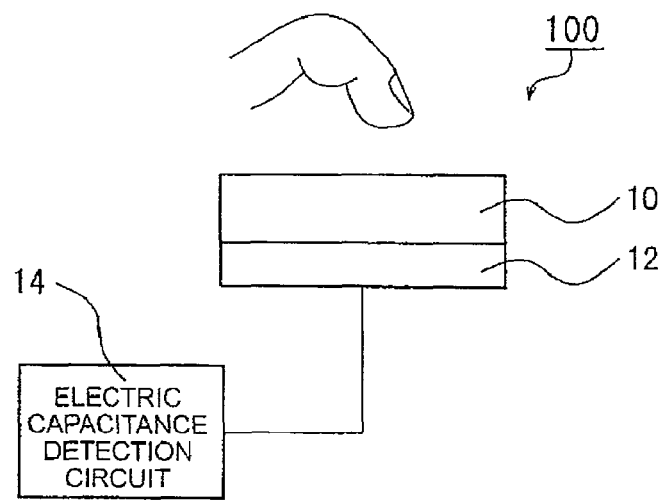
FIG. 1 is a view illustrating a conventional touch switch.
Figure 2:
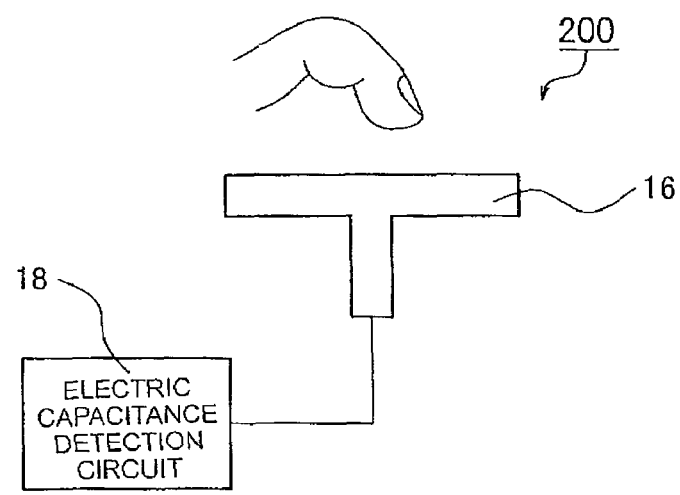
FIG. 2 is a view illustrating another conventional touch switch.
Figure 3:
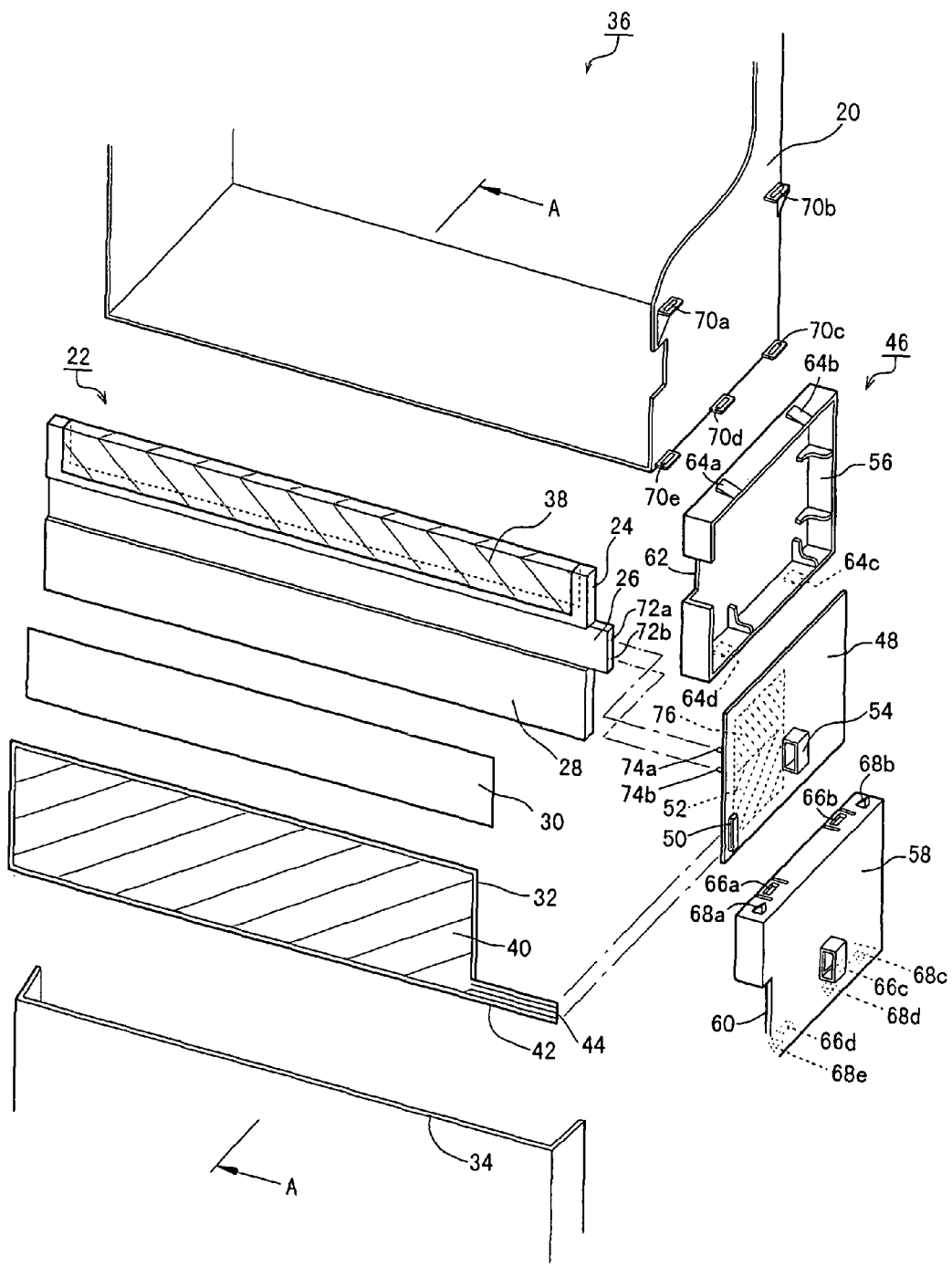
FIG. 3 is an exploded perspective view illustrating a touch switch according to the present invention applicable to an automotive door pocket illumination system.
Figure 4:
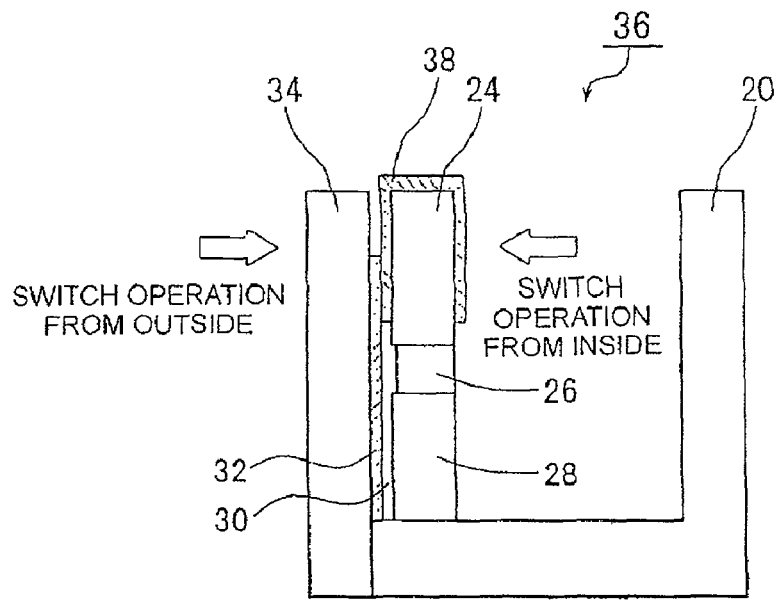
FIG. 4 is a cross-sectional view illustrating the touch switch of the present invention, taken along a line A-A of FIG. 3.

An embodiment of the present invention will be described with reference to attached drawings. FIG. 3 is an exploded perspective view illustrating a touch switch according to the present invention applicable to a door pocket illumination system provided in a door trim near a driver seat of an automotive vehicle. FIG. 4 is a cross-sectional view of the touch switch according to the present invention taken along a line A-A of FIG. 3.

As shown in FIGS. 3 and 4, a door trim body 20 includes right, left, and rear side plates. The door trim body 20 has a front side opened to a passenger compartment and holding a rectangular lens assembly 22 extending in the longitudinal direction (i.e., in the right-and-left direction). The lens assembly 22 includes an upper lens 24, a light guide plate 26, and a lower lens 28 having rectangular resin-made bodies extending in the right-and-left direction and successively layered in this order. A rectangular adhesive double-coated tape 30, extending in the right-and-left, is adhered on the front surface of the lower lens 28 of the lens assembly 22.

A rectangular flexible substrate 32, extending in the right-and-left, has a rear surface adhered on the front surface of the tape 30. The flexible substrate 32 has middle and upper portions opposed to front surfaces of the upper lens 24 and the light guide plate 26 of the lens assembly 22. A pocket frontplate 34 has a rear surface disposed on the front surface of the flexible substrate 32.

As described above, the door trim body 20 can form the right, left, and rear sidewalls of a door pocket 36. The lens assembly 22, the adhesive double-coated tape 30, the flexible substrate 32 and the pocket frontplate 34, which are assembled together, can form a front sidewall of the door pocket 36. The door pocket 36 has a boxlike configuration with an opened top.

The door pocket 36 includes a light source that can illuminate the interior of the door pocket 36 so that a user can search and find the belongings in the dark. A touch switch 300 according to the present embodiment can be used as a means for turning on and off the light source.

The touch switch 300 has a panel surface coated with a conductive metallic layer. The conductive metallic layer extends from a front surface, via an upper surface, to a rear surface of the upper lens 24, in a reversed U shape when seen in a cross-sectional view of the lens assembly 22 taken along a plane extending in the back-and-forth direction.

The conductive metallic layer can be a sputter layer 38, i.e., a metallic thin film formed by sputtering. The sputter layer 38 can function as an electric capacitance detection electrode. The sputter layer 38 provides a metallic glossy surface similar to a mirror surface.

The sputter layer 38 can contact with a conductive pattern 40 formed on a surface of the flexible substrate 32 in a region where the front surface of the upper lens 24 is coated. The sputter layer 38 and the conductive pattern 40 are electrically connected to each other.

The conductive pattern 40 includes lead wires 42 (i.e., electric signal leads) integrated in a band shape and extending from a lower right edge of the flexible substrate 32 to the right. The lead wires 42 have distal ends 44 connected to a connector 50 of an electronic control unit (ECU) substrate 48 in an ECU box 46. The ECU box 46 is fixed on a right side plate (i.e., an outside surface) of the door trim body 20. The connector 50 is electrically connected to an electric capacitance detection circuit 52 provided on the ECU substrate 48.

Thus, the sputter layer 38 is electrically connected via the flexible substrate 32 to the electric capacitance detection circuit 52. The flexible substrate 32 can include a soft film surface, such as a polyimide film or a PET film, on which the conductive pattern 40 (including a copper foil and conductive paste) is arranged.

The ECU substrate 48 is a rectangular substrate that can be engaged with an opened inner casing cover 56 and accommodated in the ECU box 46. On the surface of the ECU substrate 48 is mounted, (on its left-hand surface), the electric capacitance detection circuit 52 detecting an electric capacitance change, two light emitting diodes (i.e., LED 74a and LED 74b) each functioning as a light source for illuminating the interior of the door pocket 36, and an LED control circuit 76 controlling the ON/OFF state of each LED.

Furthermore, on the reverse surface (right-hand surface) of the ECU substrate 48 is mounted the connector 50 and a wiring terminal 54. The connector 50 can electrically connect the ECU substrate 48 to the distal ends 44 of the lead wires 42 of the flexible substrate 32. The wiring terminal 54 can electrically connect the ECU substrate 48 to a vehicle battery (not shown). The connector 50 is located at the front end of the ECU substrate 48, while the wiring terminal 54 is located at the central portion of the ECU substrate 48.

The electric capacitance detection circuit 52 can detect an electric capacitance change occurring in the sputter layer 38 when a user's finger approaches or contacts the sputter layer 38. The LED control circuit 76 can input a detection value of the electric capacitance detection circuit 52. The LED control circuit 76 can change drive current supplied to the LED 74a and the LED 74b based on the detection value so as to realize ON/OFF control of each LED.

The LED 74a and the LED 74b are arrayed vertically along the front edge, at the central region, on the left-hand surface of the ECU substrate 48. The LED control circuit 76 provided on the ECU substrate 48 can ON/OFF control the LED 74a and the LED 74b. The LED 74a and the LED 74b have distal ends that can be inserted into two insert holes 72a and 72b formed on a right end surface of a protruding portion of the light guide plate 26 of the lens assembly 22. The protruding portion of the light guide plate 26 protrudes to the right.

The light guide plate 26 can guide light emitted from the LED 74a and the LED 74b to its interior. More specifically, the light guide plate 26 can guide the light of respective LEDs 74a and 74b in the longitudinal direction of the door pocket 36 and can supply light to each of the upper lens 24 and the lower lens 28. Each of the upper lens 24 and the lower lens 28 has the capability of diffusing the input light to uniformly illuminate the interior of the door pocket 36.

The ECU box 46 includes the inner casing cover 56 and an outer casing cover 58. The inner casing cover 56 has a rectangular body with the left side of its bottom disposed on the right side of the door trim body 20 and an opening at its right side. The outer casing cover 58 has a rectangular body having an opening opposed to the opening of the inner casing cover 56. The inner casing cover 56 and the outer casing cover 58, when coupled together, can form a closed interior space in the ECU box 46.

The outer casing cover 58 has a cutout portion 60, at its lower front end, through which the distal ends 44 of the lead wires 42 of the flexible substrate 32 can be connected to the connector 50 of the ECU substrate 48. Moreover, the inner casing cover 56 has a cutout portion 62, at its central front end, through which the right edge of the light guide plate 26 of the lens assembly 22 can be inserted into the ECU box 46.

The inner casing cover 56 has elastic engaging projections 64a, 64b, 64c and 64d protruding outward from back-and-forth ends of its upper and lower side plates. The elastic engaging projection 64a through 64d can engage with engaging holes 66a, 66b, 66c and 66d provided, at corresponding portions, on the upper and lower side plates of the outer casing cover 58. Thus, the outer casing cover 58 can be coupled with the inner casing cover 56 in a condition that the side plates of the outer casing cover 58 surround the side plates of the inner casing cover 56.

Furthermore, the outer casing cover 58 has two engaging hooks 68a and 68b protruding outward from back-and-forth ends of its upper side plate and three engaging hooks 68c, 68d and 68e protruding outward from back-and-forth ends and a central portion of its lower side plate. The engaging hooks 68a through 68e can engage with engaging holes 70a, 70b, 70c, 70d and 70e provided, at corresponding portions, on the right side plate of the door trim body 20.

Thus, the ECU box 46 can be fixed on the right side plate of the door trim body 20 in a condition that a left-hand surface of the inner casing cover 56 is brought into contact with the outside surface of the right side plate of the door trim body 20.

Figure 6:
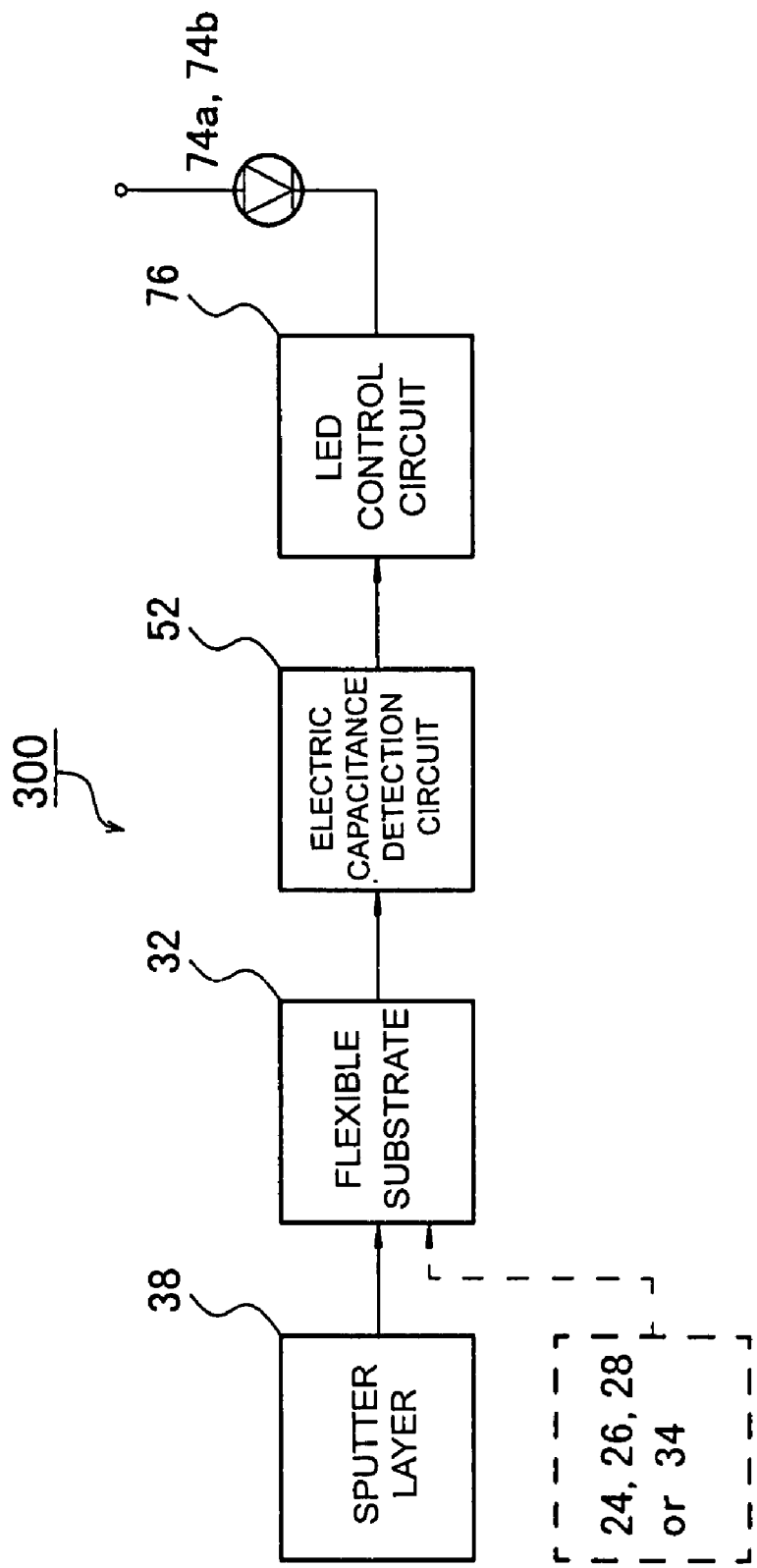
FIG. 6 is a circuit block diagram illustrating the touch switch of the present invention.

FIG. 6 is a circuit block diagram of a door pocket illumination system including the touch switch 300 according to the present invention.

When someone brings their finger close to or places it on the sputter layer 38 extending along the upper front opening periphery of the door pocket 36, an electric capacitance change is caused between the sputter layer 38 and the finger. The electric capacitance detection circuit 52 provided on ECU substrate 48 can detect the electric capacitance change via the flexible substrate 32.

The electric capacitance detection circuit 52 outputs a detection signal to the LED control circuit 76 to turn on the LED 74a and the LED 74b. The light emitted from the LED 74a and the LED 74b can enter into the light guide plate 26 from the right end surface of the light guide plate 26. There, the light is able to diffuse in the interior of the light guide plate 26 and advance in the longitudinal direction, to enter into the upper lens 24 and the lower lens 28 disposed at the upper and lower sides of the light guide plate 26. Both the upper lens 24 and the lower lens 28 are capable of uniformly diffusing the input light to uniformly illuminate the interior of the door pocket 36.

As apparent from the above description, the touch switch of the present embodiment can illuminate the interior of the door pocket 36 when a user brings a finger (or their hand) close to, or places it on, the upper front opening periphery of the door pocket 36. Thus, the touch switch of the present invention is useful and can improve driving safety.

Moreover, the touch switch of the present embodiment has a switch electrode exposed on an outer panel surface so that a user can easily touch and the switch does not malfunction when the electric capacitance change amount is small.

Additionally, if the sputter layer 38 (i.e., metallic thin layer) is thin, a transparent visual appearance can be obtained, while, if the sputter layer 38 is thick, a metallic visual appearance can be obtained. In other words, the visual appearance can be arbitrarily determined in consideration of factors such as the overall design of a panel surface including the sputter layer 38.

In the above-described embodiment, the sputter layer 38 can be designed with appropriate light-transmissivity. When this is done, the interior light of the upper lens 24 can pass through the sputter layer 38 and leak into the passenger compartment. On the other hand, the external light can pass through the sputter layer 38 and cause reflections in the sputter layer 38 which leak to the outside.

Thus, the hue of the upper lens 24 can be preferably mixed with the hue of the sputter layer 38 (e.g., metallic gloss similar to a mirror surface). The sputter layer 38 can realize a glossy surface providing a beautiful visual appearance with iridescent or dichromatic effects.

As described above, when the sputter layer 38 has appropriate light-transmissivity, the hue of an underlying base resin layer can be effectively utilized to improve the visual design of switch. Thus, the present embodiment can improve the degree of freedom in determining and selecting the visual design of a panel surface.

A preferable light-transmissivity can be obtained in the sputter layer 38 when the thickness of the sputter layer 38 is in a range from 5 nm to 500 nm. Furthermore, the sputter layer 38 can emphasize metallic gloss when the sputter layer 38 is thicker. The advantageous functions and effects of the present invention can be obtained with any of these configurations.

If desired, the present embodiment can be configured to disable any switching operations from the outside of the door pocket 36 to prevent the LED 74a and the LED 74b from being erroneously turned on.

For example, the electric capacitance change amount is different outside and inside the door pocket 36. As shown in FIG. 4, the sputter layer 38 is exposed on an upper surface of the front opening periphery of the door pocket 36. Therefore, an electric capacitance change caused in response to a user's switching operation (e.g., approach or contact of a finger) from the interior of the door pocket is larger than an electric capacitance change caused in response to a user's switching operation from the exterior of the door pocket.

Hence, considering the difference in the change amount, it is useful to set a predetermined threshold for verification as to whether the detection amount exceeds the threshold. The LED control circuit 76 can be modified to determine, based on the comparison between a detection amount and the threshold, whether the user's operation was performed from the inside or outside of the door pocket. When a user touches the switch from the outside of the door pocket, the LED control circuit 76 can prevent the LED 74a and the LED 74b from turning on. When a user touches the switch from the inside of the door pocket, the LED control circuit 76 can turn on the LED 74a and the LED 74b.

Moreover, the switch ON/OFF control can be performed based on any other signal representing an electric capacitance change that can be discriminated inside and outside the door pocket. For example, The LED control circuit 76 can change the luminance of respective LEDs 74a and 74b in a stepwise fashion according to a detected electric capacitance change amount. For example, the invention can be configured such that the LED control circuit 76 turns on only one LED 74a when a user touches the switch from the outside of the door pocket, but turns on both the LED 74a and the LED 74b when the user touches the switch from the inside of the door pocket.

Figure 5:
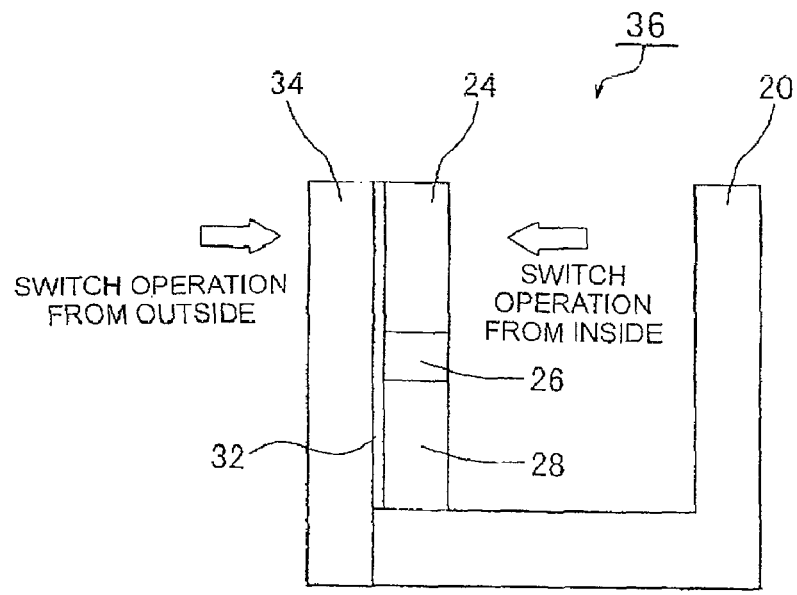
FIG. 5 is a cross-sectional view illustrating a conventional touch switch, corresponding to FIG. 4.

FIG. 5 is a cross-sectional view illustrating a conventional touch switch applicable to a door pocket illumination system, corresponding to FIG. 4. With this conventional switch, the circuit block diagram can be arranged to include the flexible substrate 32 as an electrode (refer to a dotted line partly indicated in FIG. 6), such that the conventional touch switch detects an electric capacitance change via the lens assembly 22 or the pocket frontplate 34. Therefore, compared to the touch switch 300 of the present invention, the conventional touch switch cannot easily differentiate whether a user has touched the switch from the inside or outside of the door pocket. The conventional touch switch is therefore not capable of changing the switch action depending on such a difference in user operation.

In the above-described embodiment, the sputter layer 38 can be directly formed on the surface of the resin-made upper lens 24 (i.e., base member). It is also useful to form an insulating coating layer on the surface of the upper lens 24 and then form the above-described sputter layer 38 on the insulating coating layer. It is also useful to prepare a transparent film with the sputter layer 38 formed thereon and then bond the transparent film onto the surface of the upper lens 24 using appropriate adhesive. In any case, the functions and effects of the present invention can be obtained.

Furthermore, to protect the sputter layer 38, a transparent resin film can be formed as a top coat on the surface of the sputter layer 38. The advantageous functions and effects of the present invention can be also obtained with such a configuration.

Additionally, the sputter layer 38 can be formed by sputtering metallic materials including insulating additive materials over the entire design surface of the upper lens 24 (i.e., on the base resin layer).

Desired decoration for indicating operation contents of the switch can be formed on the surface of the sputter layer 38. As one presently commercially-available example, Dept Corp. provides AMO Material (product name) which can be used for forming the sputter layer 38.

The above-described embodiment can form a metallic thin film layer by vaporization, plating, or metallic painting, instead of using a sputter layer. In this case, if the metallic thin layer is formed to have a uniform thickness, a metallic glossy surface having excellent design quality can be obtained.

In addition to the above-described door pocket, the touch switch according to the present invention can be applied to a glove compartment provided in a passenger compartment or other automotive interior/exterior decorative components or parts. For example, when the touch switch of the present invention is incorporated in a glove compartment of an automotive vehicle, a smoke decoration (using a conductive metallic thin film formed by sputtering) can be applied to a resin surface of a recessed opening periphery defining a glove compartment. In such a case, the metallic thin film can be used as a panel surface of an interior illumination switch, so that an interior illumination light turns on when a user brings a hand close to, or places it on, the opening surface of the glove compartment.

As described above, the touch switch according to the present invention includes a metallic layer formed by sputtering or a comparable method on the surface of an insulating base resin layer. The metallic layer of the touch switch can be used as an electric capacitance detection electrode. The metallic layer can provide a beautiful metallic glossy appearance similar to a mirror surface. The metallic layer can be used as a panel surface providing a glossy appearance with iridescent or dichromatic effects obtainable from the hue of a base resin layer transmitted via the metallic layer. Thus, the present invention can provide a decorative panel surface having excellent visual design quality. Moreover, the touch switch according to the present invention can reduce malfunction in switching operations and can improve the degree of freedom available for designing switches.

What is claimed is:

1. A touch switch of an illumination system comprising:
    an insulating illumination lens, having a front surface, an upper surface, and a rear surface, and provided with an automotive interior or exterior decorative component;
    a conductive layer provided on a surface of the illumination lens;
    an electric capacitance detection circuit electrically connected to the conductive layer to detect an electric capacitance change caused when a human body approaches or contacts the conductive layer;
    wherein the conductive layer is a light-transmissive sputter layer formed by sputtering;
    wherein light having passed through the illumination lens and the conductive layer illuminates an inner space of the automotive interior or exterior decorative component; and
    wherein the sputter layer extends from the front surface, via the upper surface, to the rear surface of the illumination lens.

2. The touch switch of an illumination system according to claim 1, wherein the thickness of the sputter layer falls within the range of 5 nm to 500 nm.

3. The touch switch of an illumination system according to claim 1, further comprising a top coat layer coated on a surface of the sputter layer, wherein the top coat layer is a transparent resin film capable of protecting the sputter layer.

4. The touch switch of an illumination system according to claim 1, further comprising a light source that can realize a stepwise change of luminance in accordance with the electric capacitance change detected by the electric capacitance detection circuit.

5. A touch switch of an illumination system for an automotive component comprising:
    an insulating illumination lens, having a front surface, an upper surface, and a rear surface;
    a conductive layer provided on a surface of the illumination lens;
    an electric capacitance detection circuit electrically connected to the conductive layer to detect an electric capacitance change caused when a human body approaches or contacts the conductive layer;
    wherein the conductive layer is a light-transmissive sputter layer formed by sputtering;
    wherein the sputter layer is exposed on an upper surface of a front opening periphery of the component so that the electric capacitance detection circuit detects an electric capacitance change amount that is different when the human body approaches or contacts the conductive layer from the outside of an automotive component than when the human body approaches or contacts the automotive component from the inside; and
    wherein the sputter layer extends from the front surface, via the upper surface, to the rear surface of the illumination lens.

6. The touch switch of claim 5 further comprising a light source that can realize a stepwise change of luminance in accordance with the electric capacitance change detected by the electric capacitance detection circuit.

7. A touch switch of an illumination system comprising:
    an insulating illumination lens provided with an automotive interior or exterior decorative component;
    a conductive layer provided on a surface of the illumination lens;
    an electric capacitance detection circuit electrically connected to the conductive layer to detect an electric capacitance change caused when a human body approaches or contacts the conductive layer;
    wherein the conductive layer is a light-transmissive sputter layer formed by sputtering;
    wherein light having passed through the illumination lens and the conductive layer illuminates an inner space of the automotive interior or exterior decorative component; and the sputter layer having a portion that is exposed on an upper surface of a front opening periphery of the automotive component and a portion that is hidden in the automotive component so that the electric capacitance change is different when the human body approaches or contacts the touch switch from the outside or the inside of the automotive component so as to enable control of the touch switch.

8. The touch switch of claim 7, wherein the thickness of the sputter layer falls within the range of 5 nm to 500 nm.

9. The touch switch of claim 7, further comprising a top coat layer coated on a surface of the sputter layer, wherein the top coat layer is a transparent resin film capable of protecting the sputter layer.

10. The touch switch of claim 7, further comprising a light source that can realize a stepwise change of luminance in accordance with the electric capacitance change detected by the electric capacitance detection circuit.

* * * * *